(12) United States Patent
Miyajima et al.

(10) Patent No.: US 8,426,260 B2
(45) Date of Patent: Apr. 23, 2013

(54) COMPOUND SEMICONDUCTOR DEVICE AND METHOD OF MANUFACTURING THE SAME

(75) Inventors: Toyoo Miyajima, Kawasaki (JP);
Toshihide Kikkawa, Kawasaki (JP);
Kenji Imanishi, Kawasaki (JP);
Toshihiro Ohki, Kawasaki (JP);
Masahito Kanamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/294,726

(22) Filed: Nov. 11, 2011

(65) Prior Publication Data
US 2012/0138948 A1 Jun. 7, 2012

(30) Foreign Application Priority Data
Dec. 2, 2010 (JP) ................. 2010-269673

(51) Int. Cl.
*H01L 21/338* (2006.01)
*H01L 29/66* (2006.01)

(52) U.S. Cl.
USPC .......................................... 438/173; 257/220

(58) Field of Classification Search .......... 438/172–175, 438/191, 192; 257/217–220
See application file for complete search history.

(56) References Cited

U.S. PATENT DOCUMENTS

| | | | |
|---|---|---|---|
| 6,787,820 B2 * | 9/2004 | Inoue et al. | 257/192 |
| 7,838,904 B2 * | 11/2010 | Nakazawa et al. | 257/194 |
| 2009/0008677 A1 | 1/2009 | Kikkawa | |
| 2009/0045438 A1 * | 2/2009 | Inoue et al. | 257/192 |

FOREIGN PATENT DOCUMENTS
WO WO-2007/108055 9/2007

OTHER PUBLICATIONS

Kanamura, Masahito et al., "A Normally-Off GaN HEMT with Large Drain Current", IEEJ Trans. Els, vol. 130, No. 6, Mar. 3, 2010, pp. 929-933.
Ohki, Toshihiro et al., "An over 100 W AlGaN/GaN enhancement-mode HEMT power amplifier with piezoelectric-induced cap structure", Phys. Status Solidi C 6 No. 6, Apr. 20, 2009, pp. 1365-1368.

* cited by examiner

*Primary Examiner* — Calvin Lee
(74) *Attorney, Agent, or Firm* — Fujitsu Patent Center

(57) ABSTRACT

A compound semiconductor device includes: an electron transport layer formed over a substrate; an electron supply layer formed over the electron transport layer; and a cap layer formed over the electron supply layer; the cap layer includes a first compound semiconductor layer containing GaN; a second compound semiconductor layer containing AlN, which is formed over the first compound semiconductor layer; a third compound semiconductor layer containing GaN, which is formed over the second compound semiconductor layer; and at least one of a first AlGaN-containing layer and a second AlGaN-containing layer, with the first AlGaN-containing layer formed between the first compound semiconductor layer and the second compound semiconductor layer and the Al content increases toward the second compound semiconductor layer, and the second AlGaN-containing layer formed between the second compound semiconductor layer and the third compound semiconductor layer and the Al content increases toward the second compound semiconductor layer.

16 Claims, 9 Drawing Sheets

RELATED ART

COMPOUND SEMICONDUCTOR DEVICE AND METHOD OF MANUFACTURING THE SAME

CROSS-REFERENCE TO RELATED APPLICATIONS

This application is based upon and claims the benefit of priority of the prior Japanese Patent Application No. 2010-269673, filed on Dec. 2, 2010, the entire contents of which are incorporated herein by reference.

FIELD

The present invention relates to a compound semiconductor device and a method of manufacturing the compound semiconductor device.

BACKGROUND

There have been active developments in compound semiconductor devices in which a GaN layer and an AlGaN layer are formed over a substrate and the GaN layer functions as an electron transport layer. An example of such compound semiconductor devices is a GaN-based high electron mobility transistor (HEMT). The GaN-based HEMTs use a two-dimensional electron gas (2DEG) formed in a high concentration at an AlGaN/GaN heterojunction interface.

GaN has a higher bandgap (3.4 eV) than Si (1.1 eV) or GaAs (1.4 eV). That is, GaN exhibits a high breakdown field strength. GaN also has a high saturated electron velocity. Thus, GaN is a potential material for compound semiconductor devices capable of high-voltage operation and high output. GaN-based HEMTs are expected to serve as high-efficiency switching elements and high-voltage power devices in electric vehicles and the like.

GaN-based HEMTs which utilize a high-concentration 2DEG are usually normally-on transistors. That is, an electric current flows when there is no gate voltage applied. This current flow is because of a large number of electrons that are present in the channel. Meanwhile, GaN-based HEMTs used in high-voltage power devices are designed with the highest priority placed on a normally-off operation for failsafe reasons.

A variety of studies have been carried out on normally-off GaN-based HEMTs.

In a GaN-based HEMT illustrated in FIG. 1A, a semi-insulating SiC substrate 201 supports a buffer layer 202, an i-GaN layer 203, an n-AlGaN layer 204, an n-GaN layer 205, an i-AlN layer 206 and an n-GaN layer 207. Two openings are formed in the n-GaN layer 205, the i-AlN layer 206 and the n-GaN layer 207. A source electrode 209s and a drain electrode 209d are provided in the respective openings. The n-GaN layer 205, the i-AlN layer 206 and the n-GaN layer 207 have another opening in a region between the source electrode 209s and the drain electrode 209d. This opening is formed so as to penetrate to a certain depth in the n-AlGaN layer 204. An $Al_2O_3$ layer 208 is formed in this opening and extends over the n-GaN layer 207. A gate electrode 209g is provided over the $Al_2O_3$ layer 208.

In the GaN-based HEMT illustrated in FIG. 1A, the opening for the gate electrode 209g penetrates to a certain depth in the n-AlGaN layer 204 which functions as an electron supply layer. As a result, when the gate voltage is off, there is no two-dimensional electron gas immediately under the gate electrode 209g. Thus, normally-off operation is possible. FIG. 1B illustrates a conduction band line up for the GaN-based HEMT illustrated in FIG. 1A. As illustrated, a two-dimensional electron gas of higher concentration is obtainable, and thus a large current can flow. The normally-off GaN-based HEMTs thus achieve a high withstand voltage and supply a large current.

However, the GaN-based HEMTs illustrated in FIG. 1A often have a gate leakage current or a lowered withstand voltage. Further, current collapse often occurs.

The related technologies are described in WO 2007/108055, Toshihiro Ohki, "An over 100 W AlGaN/GaN enhancement-mode HEMT power amplifier with piezoelectric-induced cap structure", Phys. Status Solidi C 6, No. 6, 1365-1368, 2009, and Masahito Kanamura, "A Normally-Off GaN HEMT with Large Drain Current", IEEJ Trans. Els, Vol. 130, No. 6, 2010.

SUMMARY

According to an aspect of the invention, a compound semiconductor device includes: a substrate; an electron transport layer formed over the substrate; an electron supply layer formed over the electron transport layer; and a cap layer formed over the electron supply layer; the cap layer includes a first compound semiconductor layer containing GaN; a second compound semiconductor layer containing AlN, which is formed over the first compound semiconductor layer; a third compound semiconductor layer containing GaN, which is formed over the second compound semiconductor layer; and at least one of a first AlGaN-containing layer and a second AlGaN-containing layer, with the first AlGaN-containing layer formed between the first compound semiconductor layer and the second compound semiconductor layer and in which the Al content increases toward the second compound semiconductor layer, and the second AlGaN-containing layer formed between the second compound semiconductor layer and the third compound semiconductor layer and in which the Al content increases toward the second compound semiconductor layer.

According to another aspect of the invention, a method of manufacturing a compound semiconductor device, includes: forming an electron transport layer over a substrate; forming an electron supply layer over the electron transport layer; and forming a cap layer over the electron supply layer; wherein the forming of the cap layer includes: forming a first compound semiconductor layer containing GaN; forming a second compound semiconductor layer containing AlN over the first compound semiconductor layer; forming a third compound semiconductor layer containing GaN over the second compound semiconductor layer; and forming at least one of a first AlGaN-containing layer between the first compound semiconductor layer and the second compound semiconductor layer, the first AlGaN-containing layer having an Al content which increases toward the second compound semiconductor layer, and a second AlGaN-containing layer between the second compound semiconductor layer and the third compound semiconductor layer, the second AlGaN-containing layer having an Al content which increases toward the second compound semiconductor layer.

The object and advantages of the invention will be realized and attained by at least those elements, features, and combinations particularly pointed out in the claims.

It is to be understood that both the foregoing general description and the following detailed description are exemplary and explanatory and are not restrictive of the invention, as claimed.

DESCRIPTION OF EMBODIMENTS

The GaN-based HEMTs as noted earlier and illustrated in FIG. 1A often have a gate leakage current or a lowered withstand voltage. Further, current collapse often occurs. The present inventors studied the causes for a gate leakage current or a lowered withstand voltage in a GaN-based HEMT illustrated in FIG. 1A, and have found the following. In the GaN-based HEMT, the conduction band illustrated in FIG. 1B comes very close to the Fermi level at near the interface between the i-AlN layer 206 and the n-GaN layer 205. When a positive gate voltage is applied and the band is shifted down, a two-dimensional electron gas is formed in the vicinity of the interface. Consequently, a dielectric breakdown 210 occurs in the $Al_2O_3$ layer 208 as illustrated in FIG. 1A, resulting in a gate leakage current or a lowered withstand voltage.

Figure 1A:
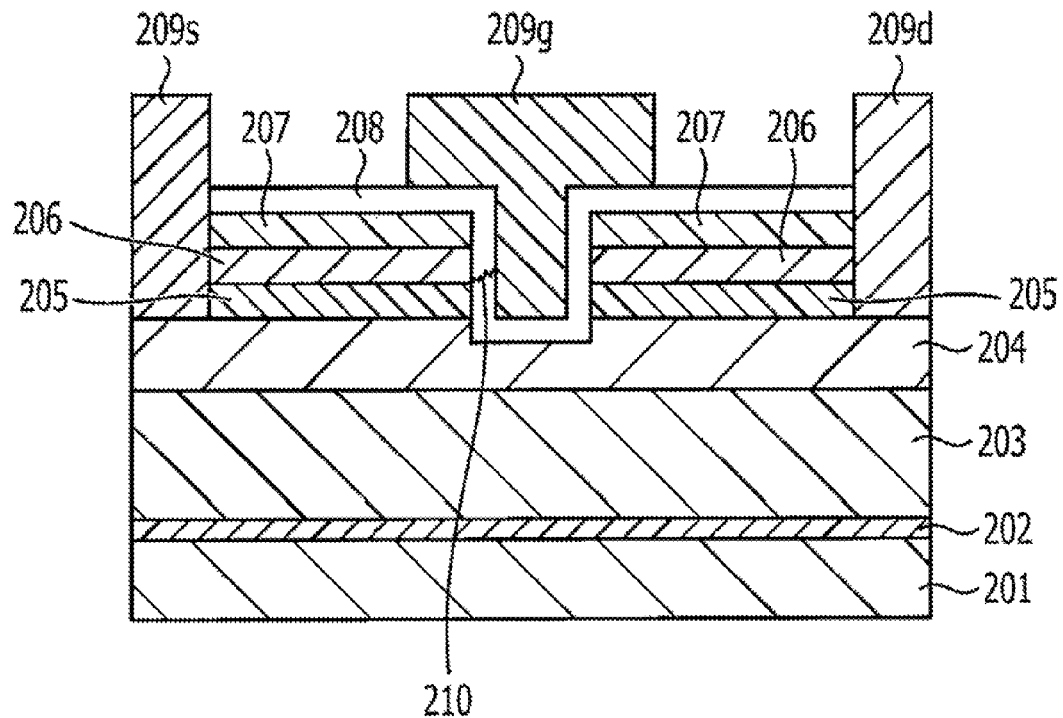
FIGS. 1A and 1B are views concerning a GaN-based HEMT.
Figure 1B:
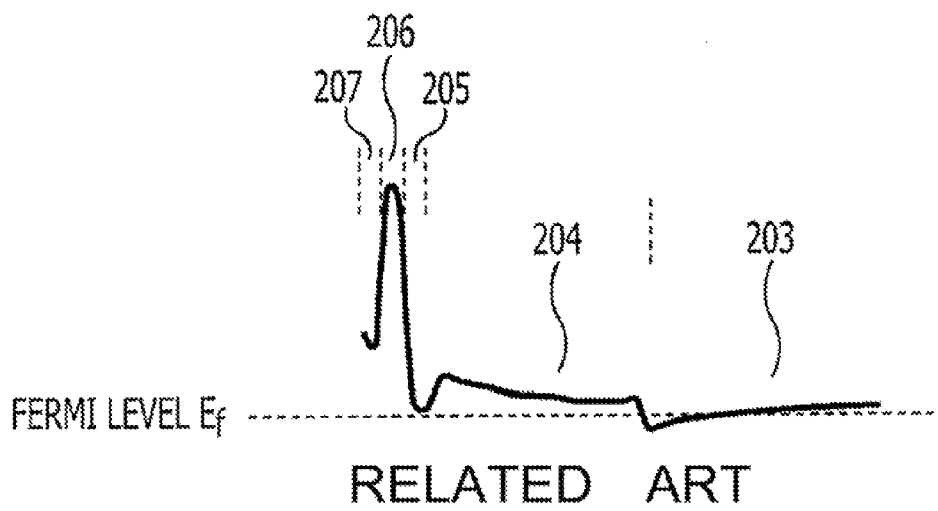

The present inventors further studied the causes of current collapse in a GaN-based HEMT illustrated in FIG. 1A, and have found the following. A dislocation and a point defect are produced by the relaxation of strain to match the lattices of the i-AlN layer 206 and the n-GaN layer 207. In particular, strains exert a marked influence when the thickness of these layers is in the order of nanometers, and a lattice defect occurs easily in the vicinity of the surface of the n-GaN layer 207. Such defects increase the interface state density between the gate electrode 209g and the drain electrode 209d, thus resulting in current collapse.

Figure 2A:
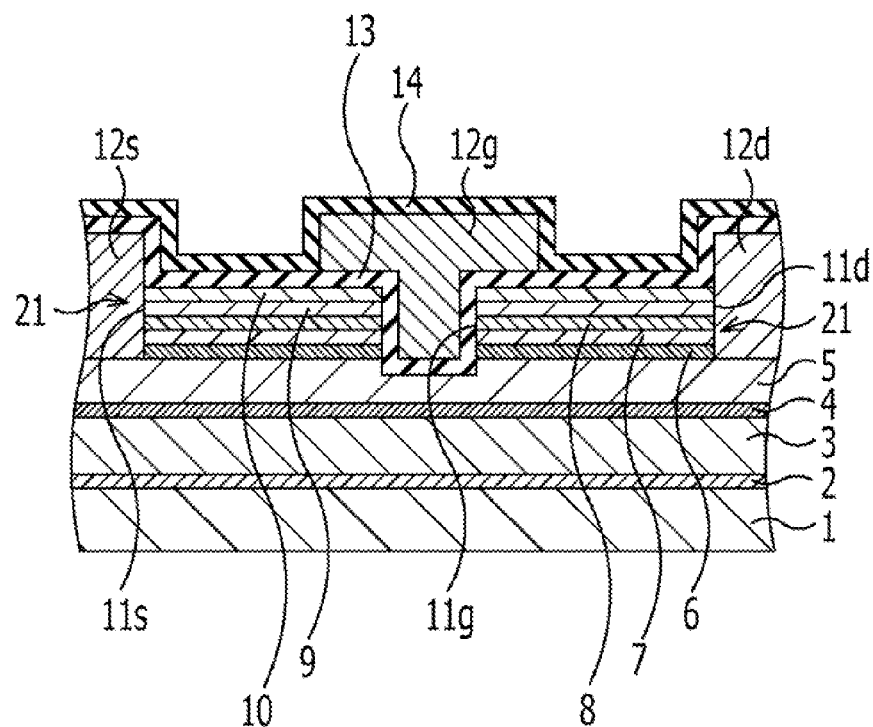
FIGS. 2A and 2B illustrate a structure of a GaN-based HEMT according to an embodiment.
Figure 2B:
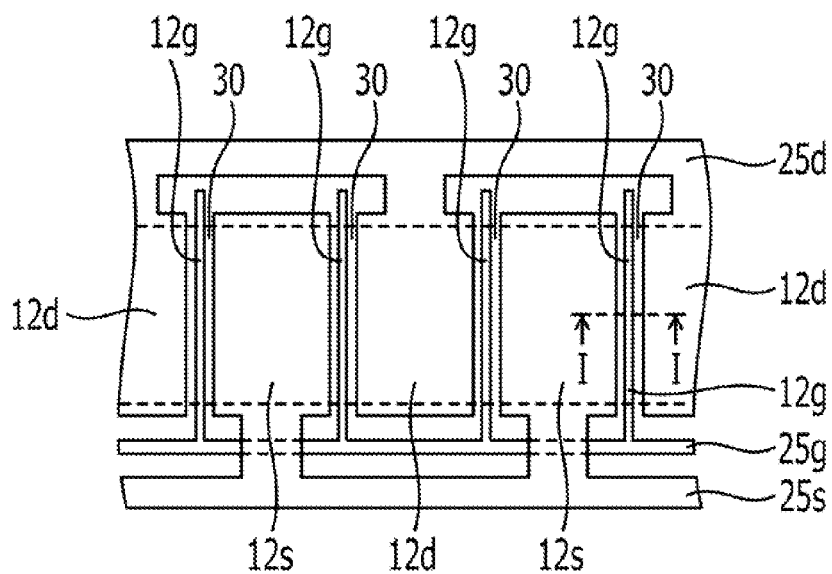

Hereinbelow, embodiments will be described in detail with reference to the attached drawings. FIGS. 2A and 2B illustrate a structure of a GaN-based HEMT (compound semiconductor device) according to an embodiment.

In an embodiment illustrated in FIG. 2A, a substrate 1 such as a SiC substrate supports thereover a nucleation layer 2, an electron transport layer 3 over the nucleation layer 2, a spacer layer 4 over the electron transport layer 3, and an electron supply layer 5 over the spacer layer 4. The nucleation layer 2 is, for example, an AlN layer. The electron transport layer 3 is, for example, a non-doped i-GaN layer having a thickness of about 1 μm to 3 μm. The spacer layer 4 is, for example, a non-doped i-AlGaN layer having a thickness of about 5 nm. The electron supply layer 5 is, for example, an n-type n-AlGaN layer having a thickness of about 30 nm. The i-AlGaN layer and the n-AlGaN layer have a composition represented by $Al_{x1}Ga_{1-x1}N$ wherein x1 is about 0.1 to 0.5 (for example, 0.2). The n-AlGaN layer is doped with, for example, Si at approximately $1\times10^{18}$ $cm^{-3}$ to $1\times10^{20}$ $cm^{-3}$ (for example, $5\times10^{18}$ $cm^{-3}$).

A cap layer 21 is formed over the electron supply layer 5. The cap layer 21 includes an n-type n-GaN layer 6 formed over the electron supply layer 5. The cap layer 21 further includes an AlGaN-containing layer 7 which is formed over the n-type n-GaN layer 6 and in which the Al content changes in the thickness direction, a non-doped i-AlN layer 8 formed over the AlGaN-containing layer 7, an AlGaN-containing layer 9 which is formed over the i-AlN layer 8 and in which the Al content changes in the thickness direction, and an n-GaN layer 10 formed over the AlGaN-containing layer 9.

The n-GaN layer 6 and the n-GaN layer 10 each have a thickness of, for example, about 1 nm to 5 nm (for example, 2 nm). The AlGaN-containing layer 7 and the AlGaN-containing layer 9 each have a thickness of, for example, about 1 nm to 5 nm (for example, 1 nm). The i-AlN layer 8 has a thickness of, for example, about 1 nm to 5 nm (for example, 1 nm).

The cap layer 21 includes an opening 11g for a gate electrode. The opening 11g penetrates into the electron supply layer 5. That is, the opening 11g extends to a depth so as to penetrate the electron supply layer 5. In the cap layer 21, an opening 11s for a source electrode and an opening 11d for a drain electrode are formed with the opening 11g therebetween. A source electrode 12s is formed in the opening 11s, and a drain electrode 12d is formed in the opening 11d. In the opening 11g, an insulating layer 13 is formed which extends over the n-GaN layer 10. A gate electrode 12g is formed over the insulating layer 13 so as to fill the opening 11g. The gate electrode 12g includes, for example, a Ni layer about 30 nm in thickness and a Au layer about 400 nm in thickness formed thereover. The source electrode 12s and the drain electrode 12d each include, for example, a Ta layer about 20 nm in thickness and an Al layer about 200 nm in thickness formed thereover. The source electrode 12s and the drain electrode 12d are in ohmic contact with the electron supply layer 5. The thickness of the insulating layer 13 is, for example, about 2 nm to 200 nm (for example, 10 nm). The insulating layer 13 may be made of, for example, an oxide, nitride or oxynitride of Si, Al, Hf, Zr, Ti, Ta or W, and particularly preferably alumina.

A passivation layer 14 covers the gate electrode 12g, the source electrode 12s and the drain electrode 12d. The passivation layer 14 is, for example, a silicon nitride layer. In the insulating layer 13 and the passivation layer 14, openings are formed for the connection of external terminals or the like.

FIG. 2B illustrates an exemplary layout of the HEMT seen from the surface side of the substrate 1. As illustrated, the gate electrodes 12g, the source electrodes 12s and the drain electrodes 12d configure a comb-like toothed plane, with the source electrodes 12s and the drain electrodes 12d being alternately arranged. That is, a plurality of the gate electrodes 12g are mutually connected through a gate wire 25g, and a plurality of the source electrodes 12s are mutually connected through a source wire 25s. Similarly, a plurality of the drain electrodes 12d are mutually connected through a drain wire 25d. The gate electrodes 12g are arranged between the source electrodes and the drain electrodes. This multi-finger gate structure provides an improved output. The sectional view in FIG. 2A illustrates the cross section along the line I-I in FIG. 2B. An active region 30 includes layers such as the nucleation layer 2, the electron transport layer 3, the spacer layer 4 and the electron supply layer 5. The periphery of the active region 30 has been deactivated by, for example, ion implantation or mesa etching.

According to this embodiment, the AlGaN-containing layer 7 between the n-GaN layer 6 and the i-AlN layer 8 reduces the piezoelectric effect due to the lattice mismatch between the n-GaN layer 6 and the i-AlN layer 8. As a result, the conduction band energy between the n-GaN layer 6 and the i-AlN layer 8 is further from the Fermi level than in the GaN-based HEMT illustrated in FIG. 1A. Accordingly, the formation of a two-dimensional electron gas is suppressed even when a positive gate voltage is applied and the band is shifted down, thereby suppressing the occurrence of a gate leakage current and the lowering of a withstand voltage.

Further, the AlGaN-containing layer 9 between the i-AlN layer 8 and the n-GaN layer 10 reduces the elastic strain due to the lattice mismatch between the i-AlN layer 8 and the n-GaN layer 10. As a result, lattice defects such as dislocation and point defects are less likely to occur. Accordingly, the n-GaN layer 10/insulating layer 13 interface state density in a region between the gate electrode 12g and the drain electrode 12d is lower than that of the GaN-based HEMT illustrated in FIG. 1A, thereby suppressing the occurrence of a current collapse.

Next, there will be described a method of manufacturing GaN-based HEMTs (compound semiconductor devices) according to the aforementioned embodiment. FIGS. 3A to 3G are sectional views that illustrate an embodiment of the method of manufacturing GaN-based HEMTs (compound semiconductor devices).

Figure 3A:
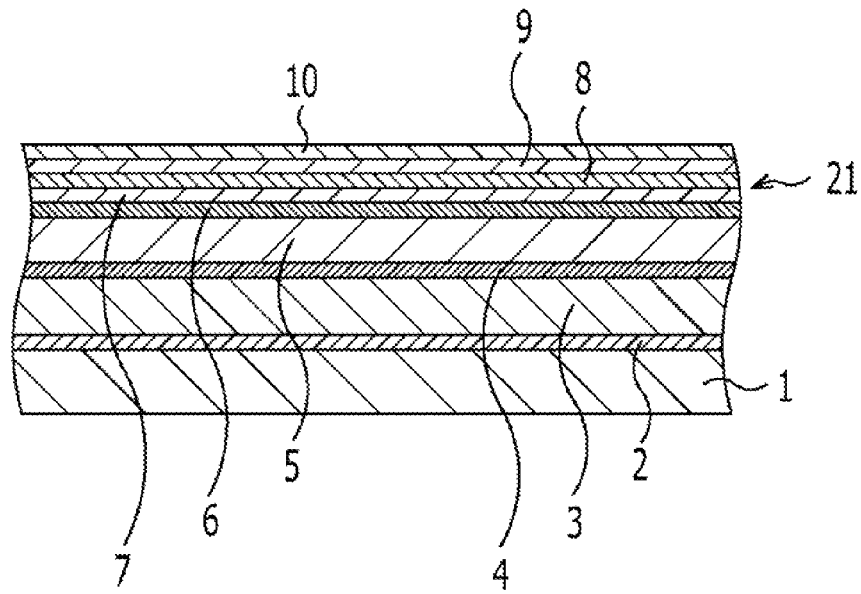
FIGS. 3A to 3G are sectional views illustrating a method of manufacturing a GaN-based HEMT according to an embodiment.

As illustrated in FIG. 3A, a nucleation layer 2, an electron transport layer 3, a spacer layer 4, an electron supply layer 5, an n-GaN layer 6, an AlGaN-containing layer 7, an i-AlN layer 8, an AlGaN-containing layer 9 and an n-GaN layer 10 are formed over a substrate 1. The nucleation layer 2, the electron transport layer 3, the spacer layer 4, the electron supply layer 5, the n-GaN layer 6, the AlGaN-containing layer 7, the i-AlN layer 8, the AlGaN-containing layer 9 and the n-GaN layer 10 may be formed by, for example, crystal growth methods such as metal organic vapor phase epitaxy (MOVPE). In a crystal growth method, the above layers may be formed continuously by selecting the material gases. The aluminum (Al) material and the gallium (Ga) material may be, for example, trimethylaluminum (TMA) and trimethylgallium (TMG), respectively. The nitrogen (N) material may be, for example, ammonia ($NH_3$). The silicon (Si) material for doping layers such as the n-GaN layer 6 and the n-GaN layer 10 may be, for example, silane ($SiH_4$).

In the formation of the AlGaN-containing layer 7, the TMA flow rate is gradually increased while the TMG flow rate is gradually lowered so that the Al content in the AlGaN-containing layer 7 will increase from the interface between the AlGaN-containing layer 7 and the n-GaN layer 6 toward the interface between the AlGaN-containing layer 7 and the i-AlN layer 8. In an embodiment, the Al content in the AlGaN-containing layer 7 is changed continuously from 0 at the interface of the AlGaN-containing layer 7 and the n-GaN layer 6 to 1 at the interface of the AlGaN-containing layer 7 and the i-AlN layer 8. In the formation of the AlGaN-containing layer 9, the TMA flow rate is gradually lowered while the TMG flow rate is gradually increased so that the Al content in the AlGaN-containing layer 9 will decrease from the interface between the AlGaN-containing layer 9 and the i-AlN layer 8 toward the interface between the AlGaN-containing layer 9 and the n-GaN layer 10. In an embodiment, the Al content in the AlGaN-containing layer 9 is changed continuously from 1 at the interface of the AlGaN-containing layer 9 and the i-AlN layer 8 to 0 at the interface of the AlGaN-containing layer 9 and the n-GaN layer 10.

After the n-GaN layer 10 is formed, a periphery of an active region 30 is deactivated. In the formation of the inactive regions, for example, the multilayer structure may be mesa-etched with a chlorine-containing gas through a photolithographically patterned resist to create grooves, or may be implanted with ions such as Ar.

Figure 3B:
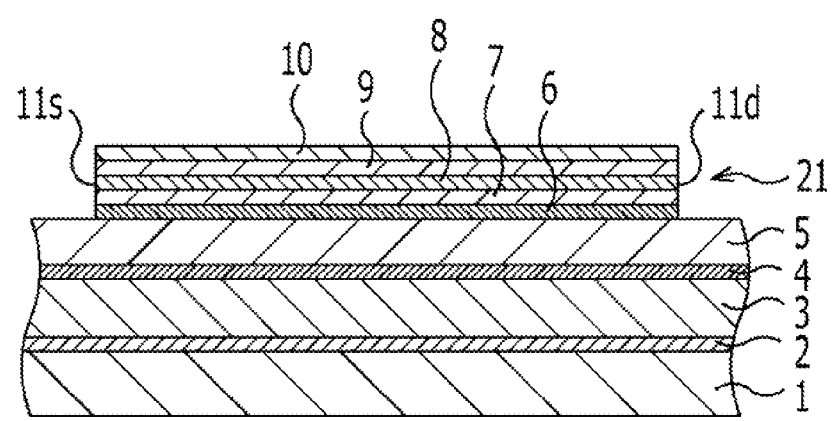

Next, a resist pattern is formed which has openings exposing regions where a source electrode 12s and a drain electrode 12d will be formed. Thereafter, the n-GaN layer 10, the AlGaN-containing layer 9, the i-AlN layer 8, the AlGaN-containing layer 7 and the n-GaN layer 6 are etched using the resist pattern as a mask. As a result, an opening 11s for a source electrode and an opening 11d for a drain electrode are formed in the n-GaN layer 10, the AlGaN-containing layer 9, the i-AlN layer 8, the AlGaN-containing layer 7 and the n-GaN layer 6 as illustrated in FIG. 3B. For example, this etching may be performed by dry etching using a chlorine-containing gas. The depth of the openings 11s and 11d may be such that the n-GaN layer 6 partially remains or the electron supply layer 5 is partially removed. That is, the depth of the openings 11s and 11d does not need to be identical to the total thickness of the n-GaN layer 10, the AlGaN-containing layer 9, the i-AlN layer 8, the AlGaN-containing layer 7 and the n-GaN layer 6.

Figure 3C:
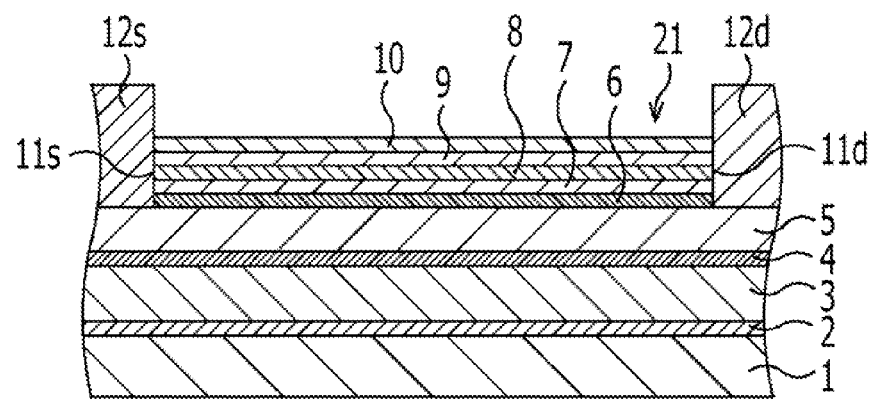

Next, as illustrated in FIG. 3C, a source electrode 12s and a drain electrode 12d are formed in the opening 11s and the opening 11d, respectively, by a lift-off process. In the formation of the source electrode 12s and the drain electrode 12d, the resist pattern used in the production of the openings 11s and 11d are removed, and a new resist pattern is provided which has openings exposing the regions where the source electrode 12s and the drain electrode 12d will be formed. Thereafter, Ta and Al are deposited, and the resist pattern is removed together with Ta and Al attached thereover. The thicknesses of the Ta layer and the Al layer are, for example, about 20 nm and about 200 nm, respectively. The structure is then subjected to a heat treatment in a nitrogen atmosphere at 400° C. to 1000° C. (for example, 550° C.) to establish an ohmic contact.

Figure 3D:
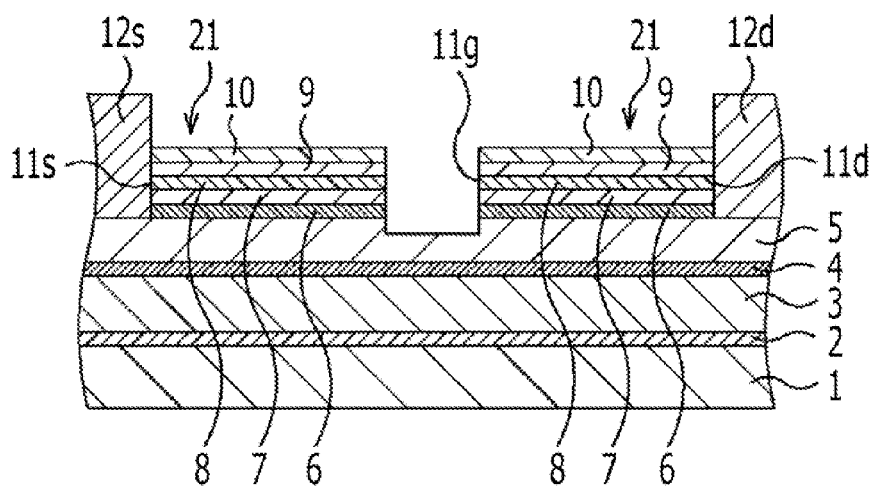

After forming the source electrode 12s and the drain electrode 12d, a resist pattern is formed which has an opening exposing a region where an opening 11g for a gate electrode will be formed. Etching is then performed using the resist pattern as a mask to create an opening 11g in the n-GaN layer 10, the AlGaN-containing layer 9, the i-AlN layer 8, the AlGaN-containing layer 7 and the n-GaN layer 6 as illustrated in FIG. 3D. In the etching process, part of the electron supply layer 5 is etched so that the opening 11g penetrates into the electron supply layer 5.

Figure 3E:
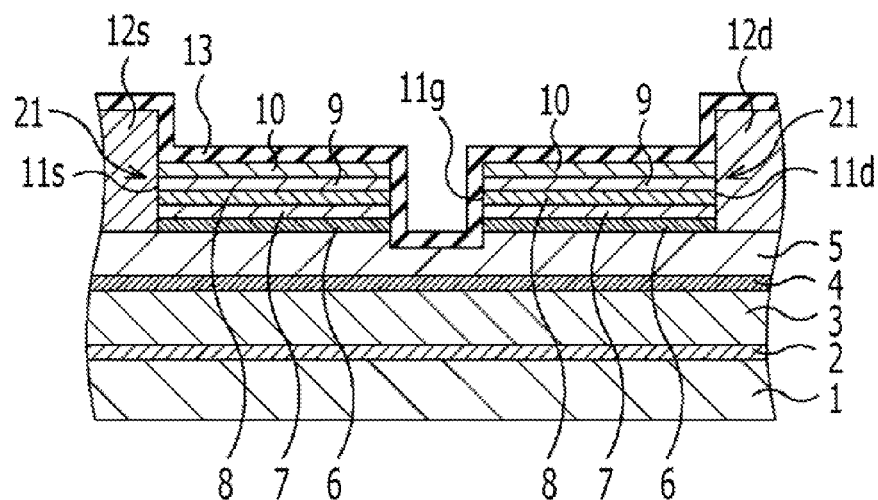

Thereafter, an insulating layer 13 is formed so as to cover the entire surface as illustrated in FIG. 3E. The insulating layer 13 may be preferably formed by an atomic layer deposition (ALD) method, a chemical vapor deposition (CVD) method, a sputtering method or the like.

Figure 3F:
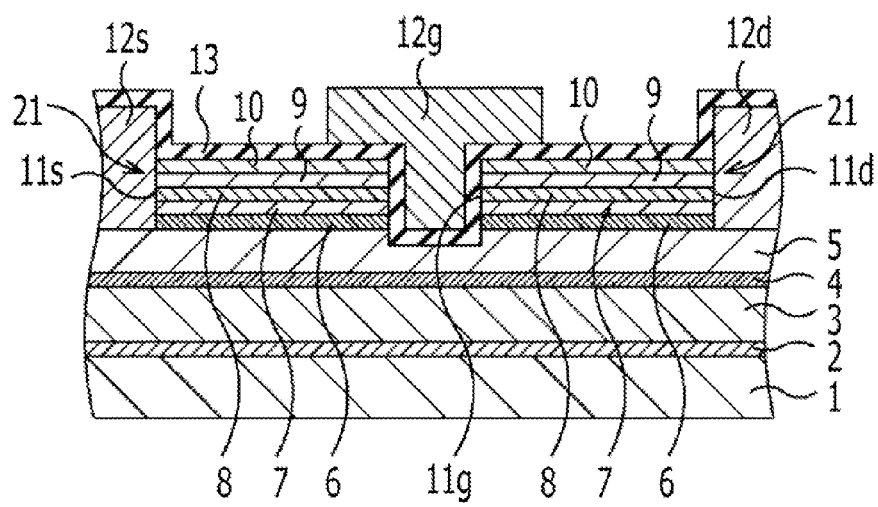

As illustrated in FIG. 3F, a gate electrode 12g is formed over the insulating layer 13 by a lift-off process so as to fill the opening 11g. In the formation of the gate electrode 12g, a resist pattern is formed which has an opening exposing a region where the gate electrode 12g will be formed. Thereafter, Ni and Au are deposited, and the resist pattern is removed together with Ni and Au attached thereover. The thicknesses of the Ni layer and the Au layer are, for example, about 30 nm and about 400 nm, respectively.

Figure 3G:
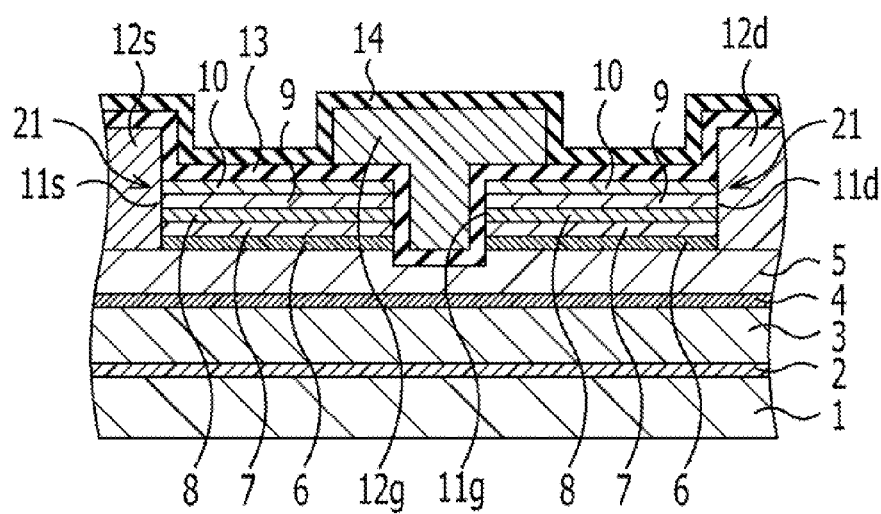

A passivation layer 14 is formed over the entire surface so as to cover the gate electrode 12g, the source electrode 12s and the drain electrode 12d as illustrated in FIG. 3G. The passivation layer 14 may be, for example, a silicon nitride layer formed by a plasma CVD method.

Thereafter, a gate wire 25g, a source wire 25s and a drain wire 25d are formed which mutually connect a plurality of the gate electrodes 12g, a plurality of the source electrodes 12s and a plurality of the drain electrodes 12d, respectively (see FIG. 2B). Thus, a GaN-based HEMT having a structure illustrated in FIG. 2A is obtained.

Components such as resistors and capacitors may be mounted over the substrate 1, thus manufacturing a monolithic microwave integrated circuit (MMIC).

Figure 4A:
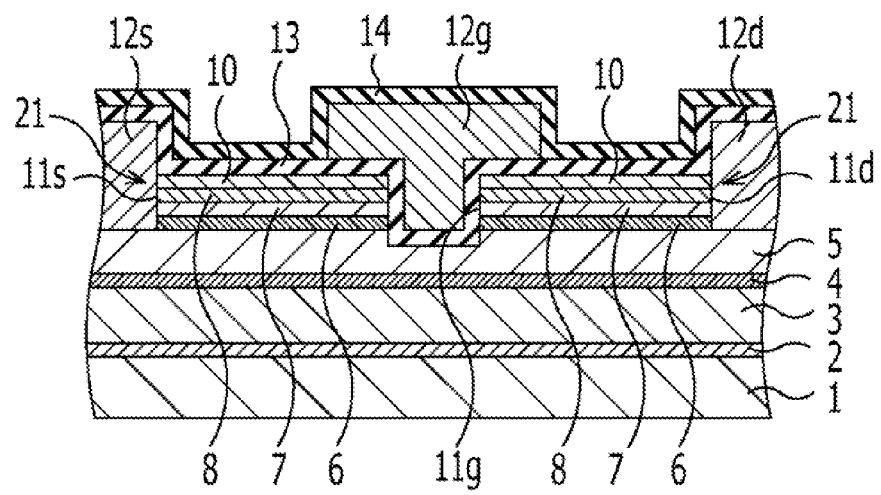
FIGS. 4A and 4B are sectional views illustrating modified embodiments.
Figure 4B:
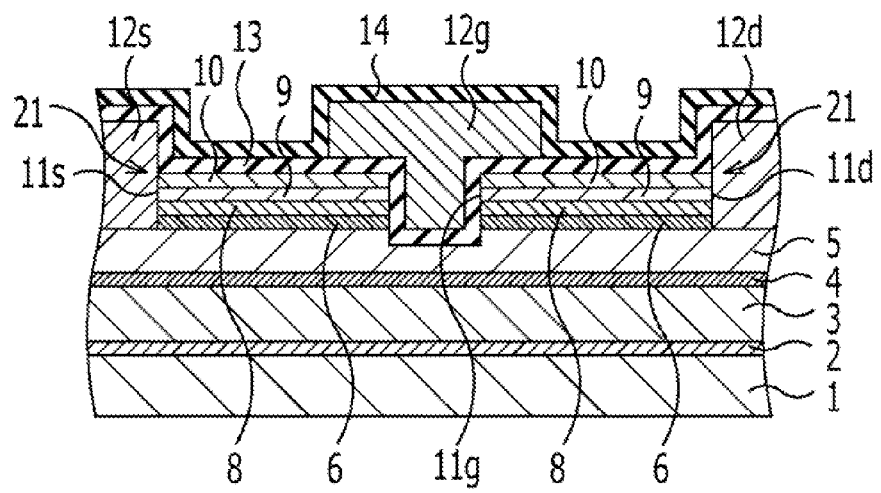

It is not necessary that the cap layer 21 include both the AlGaN-containing layer 7 and the AlGaN-containing layer 9. Even when the AlGaN-containing layer 9 is not included as illustrated in FIG. 4A, it is at least possible to suppress the occurrence of a gate leakage current and the lowering of a withstand voltage as long as the AlGaN-containing layer 7 is present. Further, even when the AlGaN-containing layer 7 is not included as illustrated in FIG. 4B, it is at least possible to suppress the occurrence of a current collapse as long as the AlGaN-containing layer 9 is present.

Figure 5:
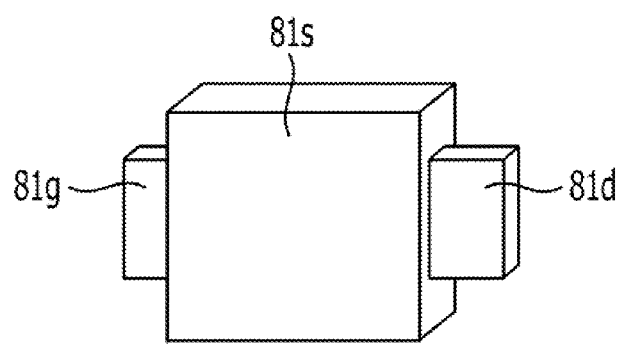
FIG. 5 illustrates an appearance of a high-output amplifier.

The GaN-based HEMT according to the aforementioned embodiment may be used as, for example, a high-output amplifier. FIG. 5 illustrates an exemplary appearance of a high-output amplifier. In this example, a source terminal 81s connected to the source electrode is provided over the surface of the package. A gate terminal 81g connected to the gate electrode, and a drain terminal 81d connected to the drain electrode each extend from the sides of the package.

Figure 6A:
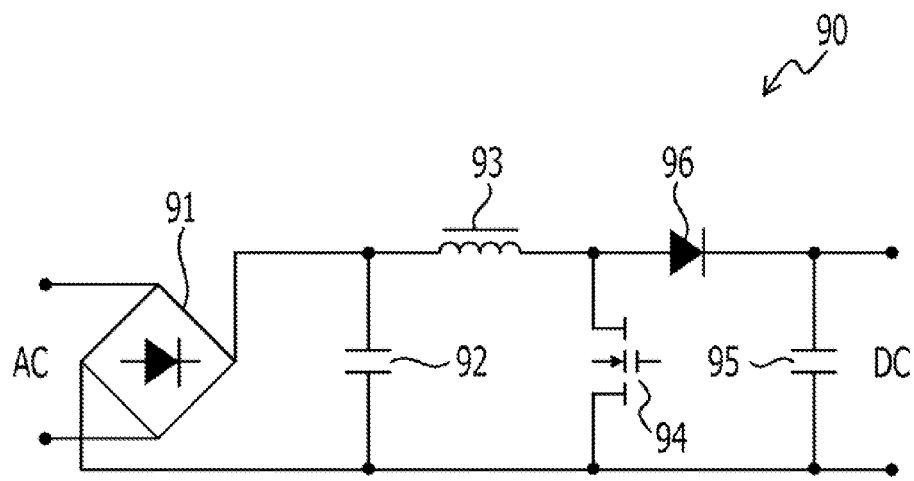
FIGS. 6A and 6B are views illustrating a power device.

Further, the GaN-based HEMT according to the aforementioned embodiment may be used as a power device. FIG. 6A is a diagram illustrating a power factor correction (PFC) circuit, and FIG. 6B illustrates a server power supply (power device) incorporating the PFC circuit illustrated in FIG. 6A.

As illustrated in FIG. 6A, a PFC circuit 90 includes a condenser 92 that is connected to a diode bridge 91 connectable with an alternating-current (AC) power supply. A terminal of a choke coil 93 is connected to a terminal of the condenser 92, and the other terminal of the choke coil 93 is connected with one terminal of a switch element 94 and an anode of a diode 96. The switch element 94 corresponds to the HEMT in the aforementioned embodiment, and the above one terminal of the switch element 94 corresponds to the drain electrode of the HEMT. The other terminal of the switch element 94 corresponds to the source electrode of the HEMT. A terminal of a condenser 95 is connected to a cathode of the diode 96. The other terminal of the condenser 92, the above other terminal of the switch element 94, and the other terminal of the condenser 95 are grounded. A direct current (DC) is thus output from between the terminals of the condenser 95.

Figure 6B:
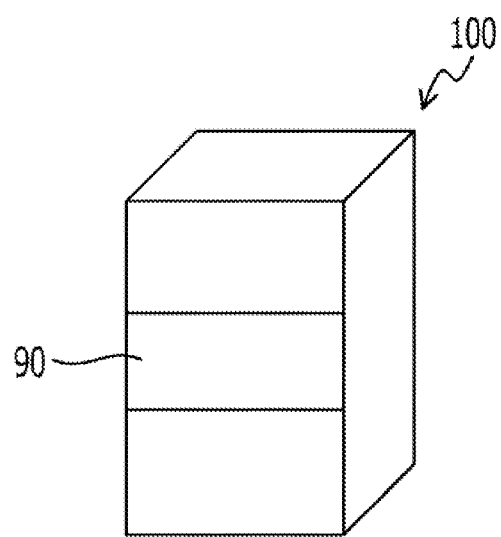

As illustrated in FIG. 6B, the PFC circuit 90 is used by being incorporated in, for example, a server power supply 100.

It is also possible to constitute a power device which is similar to the server power supply 100 but is capable of higher speed operation. Switch elements similar to the switch element 94 may be used in switch power supplies or electronic devices. Further, these semiconductor devices may be used as components in a full bridge power circuit such as a server power circuit.

In any embodiments, the substrate may be a silicon carbide (SiC) substrate, a sapphire substrate, a silicon substrate, a GaN substrate or a GaAs substrate. The substrate may be conductive, semi-insulating, or insulating.

The structures of the gate electrode, the source electrode and the drain electrode are not limited to those described in the aforementioned embodiments. For example, they may be each composed of a single layer. Further, the electrode-forming method is not limited to the lift-off process. Furthermore, the heat treatment after forming the source electrode and the drain electrode may be omitted as long as ohmic characteristics are obtained without the heat treatment. Still further, the heat treatment may be performed for the gate electrode.

The thicknesses, the materials and other conditions for the layers are not limited to those described in the above embodiments.

All examples and conditional language recited herein are intended for pedagogical purposes to aid the reader in understanding the invention and the concepts contributed by the inventor to furthering the art, and are to be construed as being without limitation to such specifically recited examples and conditions. Although the embodiments in accordance with aspects of the present invention have been described in detail, it should be understood that various changes, substitutions, and alterations could be made hereto without departing from the spirit and scope of the invention.

What we claimed is:

1. A method of manufacturing a compound semiconductor device, comprising:
    forming an electron transport layer over a substrate;
    forming an electron supply layer over the electron transport layer; and
    forming a cap layer over the electron supply layer; wherein the forming of the cap layer includes:
    forming a first compound semiconductor layer containing GaN;
    forming a second compound semiconductor layer containing AlN over the first compound semiconductor layer;
    forming a third compound semiconductor layer containing GaN over the second compound semiconductor layer; and
    forming at least one of a first AlGaN-containing layer and a second AlGaN-containing layer, with the first AlGaN-containing layer to be formed between the first compound semiconductor layer and the second compound semiconductor layer, the first AlGaN-containing layer having an Al content which increases toward the second compound semiconductor layer, and the second AlGaN-containing layer to be formed between the second compound semiconductor layer and the third compound semiconductor layer, the second AlGaN-containing layer having an Al content which increases toward the second compound semiconductor layer.

2. The method of manufacturing a compound semiconductor device according to claim 1, wherein
    both the first AlGaN-containing layer and the second AlGaN-containing layer are formed.

3. The method of manufacturing a compound semiconductor device according to claim 1, wherein
    the first AlGaN-containing layer includes a lower surface and an upper surface, the first AlGaN-containing layer is formed such that the Al content in the layer changes from 0 at the lower surface to 1 at the upper surface.

4. The method of manufacturing a compound semiconductor device according to claim 1, wherein
    the second AlGaN-containing layer includes a lower surface and an upper surface, the second AlGaN-containing layer is formed such that the Al content in the layer changes from 1 at the lower surface to 0 at the upper surface.

5. The method of manufacturing a compound semiconductor device according to claim 1, wherein
    the first AlGaN-containing layer is formed to be in contact with the first compound semiconductor layer and the second compound semiconductor layer.

6. The method of manufacturing a compound semiconductor device according to claim 1, wherein
    the second AlGaN-containing layer is formed to be in contact with the second compound semiconductor layer and the third compound semiconductor layer.

7. The method of manufacturing a compound semiconductor device according to claim 1, further comprising:
    forming an opening in the cap layer to a depth that penetrates into the electron supply layer;
    forming an insulating layer in the opening; and
    forming a gate electrode over the insulating layer in the opening.

8. The method of manufacturing a compound semiconductor device according to claim 7, wherein the insulating layer is formed to extend over the cap layer.

9. A compound semiconductor device comprising:
a substrate;
an electron transport layer formed over the substrate;
an electron supply layer formed over the electron transport layer; and
a cap layer formed over the electron supply layer;
the cap layer includes
a first compound semiconductor layer containing GaN;
a second compound semiconductor layer containing AlN, which is formed over the first compound semiconductor layer;
a third compound semiconductor layer containing GaN, which is formed over the second compound semiconductor layer; and
at least one of a first AlGaN-containing layer and a second AlGaN-containing layer, with the first AlGaN-containing layer formed between the first compound semiconductor layer and the second compound semiconductor layer and in which the Al content increases toward the second compound semiconductor layer, and the second AlGaN-containing layer formed between the second compound semiconductor layer and the third compound semiconductor layer and in which the Al content increases toward the second compound semiconductor layer.

10. The compound semiconductor device according to claim 9, wherein
the cap layer includes both the first AlGaN-containing layer and the second AlGaN-containing layer.

11. The compound semiconductor device according to claim 9, wherein
the first AlGaN-containing layer includes a lower surface and an upper surface, the Al content in the first AlGaN-containing layer changes from 0 at the lower surface to 1 at the upper surface.

12. The compound semiconductor device according to claim 9, wherein
the second AlGaN-containing layer includes a lower surface and an upper surface, the Al content in the second AlGaN-containing layer changes from 1 at the lower surface to 0 at the upper surface.

13. The compound semiconductor device according to claim 9, wherein
the first AlGaN-containing layer is in contact with the first compound semiconductor layer and the second compound semiconductor layer.

14. The compound semiconductor device according to claim 9, wherein
the second AlGaN-containing layer is in contact with the second compound semiconductor layer and the third compound semiconductor layer.

15. The compound semiconductor device according to claim 9, further comprising:
an opening formed in the cap layer to a depth that penetrates into the electron supply layer;
an insulating layer formed in the opening; and
a gate electrode formed over the insulating layer in the opening.

16. The compound semiconductor device according to claim 15, wherein
the insulating layer extends over the cap layer.

* * * * *